United States Patent
Tian et al.

(10) Patent No.: US 12,414,642 B2
(45) Date of Patent: Sep. 16, 2025

(54) DISPLAY SUBSTRATE AND PREPARATION METHOD THEREFOR, AND DISPLAY APPARATUS

(71) Applicant: BOE Technology Group Co., Ltd., Beijing (CN)

(72) Inventors: Xueyan Tian, Beijing (CN); Shiming Shi, Beijing (CN); Chunyang Wang, Beijing (CN); Zheng Liu, Beijing (CN); Liangjian Li, Beijing (CN); Dengyun Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 523 days.

(21) Appl. No.: 17/770,044

(22) PCT Filed: Jul. 6, 2021

(86) PCT No.: PCT/CN2021/104778
§ 371 (c)(1),
(2) Date: Apr. 18, 2022

(87) PCT Pub. No.: WO2022/028190
PCT Pub. Date: Feb. 10, 2022

(65) Prior Publication Data
US 2022/0384537 A1 Dec. 1, 2022

(30) Foreign Application Priority Data
Aug. 7, 2020 (CN) .......................... 202010786584.5

(51) Int. Cl.
*H10K 59/80* (2023.01)
*A47G 1/02* (2006.01)
(Continued)

(52) U.S. Cl.
CPC ............... *A47G 1/02* (2013.01); *H10K 59/12* (2023.02); *H10K 59/50* (2023.02); *H10K 59/878* (2023.02);
(Continued)

(58) Field of Classification Search
CPC ........ H10K 59/50; H10K 59/12; H10K 71/00; H10K 59/121; H10K 59/878; A47G 1/02
See application file for complete search history.

(56) References Cited

U.S. PATENT DOCUMENTS

| | | | |
|---|---|---|---|
| 2006/0066229 A1* | 3/2006 | Nimura | H10K 59/128 313/506 |
| 2014/0071550 A1 | 3/2014 | Lee | |

(Continued)

FOREIGN PATENT DOCUMENTS

| | | |
|---|---|---|
| CN | 110828695 A | 2/2020 |
| CN | 110838509 A | 2/2020 |

(Continued)

OTHER PUBLICATIONS

International Search Report for PCT/CN2021/104778 Mailed Oct. 9, 2021.
(Continued)

*Primary Examiner* — Jeff W Natalini
*Assistant Examiner* — Brandon C Fox
(74) *Attorney, Agent, or Firm* — Stephen Yang; Ling Wu; Ling and Yang Intellectual Property

(57) ABSTRACT

Provided are a display substrate and a preparation method therefor, and a display apparatus. The display substrate comprises a light emitting unit layer arranged on a base, and a mirror layer arranged on the light emitting unit layer, wherein a light modulation layer is arranged on a side of the mirror layer that is away from the base, and the light modulation layer is configured to form mirror display of a set color.

10 Claims, 5 Drawing Sheets

(51) Int. Cl.
    *H10K 59/12*     (2023.01)
    *H10K 59/38*     (2023.01)
    *H10K 59/50*     (2023.01)
    *H10K 71/00*     (2023.01)

(52) U.S. Cl.
    CPC ........... *H10K 59/879* (2023.02); *H10K 71/00* (2023.02); *H10K 59/1201* (2023.02)

(56) References Cited

U.S. PATENT DOCUMENTS

| | | | |
|---|---|---|---|
| 2016/0056415 A1 | 2/2016 | Yoo et al. | |
| 2016/0164033 A1 | 6/2016 | Moon et al. | |
| 2018/0372933 A1* | 12/2018 | Li | G02F 1/136227 |
| 2022/0255046 A1* | 8/2022 | Fang | H10K 59/879 |
| 2023/0050227 A1* | 2/2023 | Ahn | G02B 5/223 |
| 2024/0224746 A1* | 7/2024 | Ryoo | H10K 59/00 |

FOREIGN PATENT DOCUMENTS

| | | | |
|---|---|---|---|
| CN | 111796450 A | * | 10/2020 |
| CN | 111900189 A | | 11/2020 |
| JP | 2007-34061 A | | 2/2007 |

OTHER PUBLICATIONS

Second Office Action dated Oct. 28, 2023 for Chinese Patent Application No. 202010786584.5 and English Translation.

\* cited by examiner

DISPLAY SUBSTRATE AND PREPARATION METHOD THEREFOR, AND DISPLAY APPARATUS

CROSS-REFERENCE TO RELATED APPLICATION

This application is a national stage application of PCT Application No. PCT/CN2021/104778, which is filed on Jul. 6, 2021 and claims priority to Chinese Patent Application No. 202010786584.5 filed to the CNIPA on Aug. 7, 2020 and entitled "Display substrate and Preparation Method therefor, and Display Apparatus", the contents of which should be construed as being incorporated into the present application by reference.

TECHNICAL FIELD

The present disclosure relates, but is not limited, to the field of display technology, and in particular to a display substrate, a preparation method therefor, and a display apparatus.

BACKGROUND

Liquid Crystal Display (LCD) and Organic Light Emitting Diode (OLED) are the mainstream display technologies of flat display. LCD has the characteristics of small size, low power consumption and no radiation, while OLED is an active light emitting display device, which has the advantages of self-luminescence, wide viewing angle, high contrast, low power consumption and high reaction speed.

With the rapid development of display technology, multi-functional display apparatuses appear constantly, including mirror display apparatuses that realize display and mirror functions. The mirror display means that a user may see display pictures from a panel of a mirror while using the mirror, so as to meet people's various needs.

SUMMARY

The following is a summary for subject matters described herein in detail. The summary is not intended to limit the scope of protection of claims.

A display substrate includes a light emitting unit layer arranged on the base and a mirror layer arranged on the light emitting unit layer. A light modulation layer is arranged on a side of the mirror layer away from the base, and the light modulation layer is configured to form a mirror display of a set color.

In some possible implementations, the mirror layer includes a reflective layer, and the reflective layer is provided with light transmission holes thereon corresponding to multiple light emitting units; or the mirror layer includes a semi-transparent and semi-reflective layer.

In some possible implementations, the display substrate further includes an optical adhesive layer and a cover layer, the light modulation layer is arranged on the mirror layer, the optical adhesive layer is arranged on the light modulation layer, and the cover layer is arranged on the optical adhesive layer.

In some possible implementations, the display substrate further includes a cover layer arranged on a side of the mirror layer away from the base, and the light modulation layer is arranged on a surface at a side of the cover layer adjacent to the base or on a surface at a side of the cover layer away from the base.

In some possible implementations, the light modulation layer includes multiple sub-layers stacked, the multiple sub-layers include a first refractive index layer with a first refractive index and a second refractive index layer with a second refractive index, the first refractive index layer and the second refractive index layer are alternately arranged in the multiple sub-layers, and the first refractive index is greater than the second refractive index.

In some possible implementations, the light modulation layer includes a first sub-layer, a second sub-layer, and a third sub-layer that are stacked; or the light modulation layer includes a first sub-layer, a second sub-layer, a third sub-layer, a fourth sub-layer and a fifth sub-layer that are stacked; each of the first sub-layer, the third sub-layer and the fifth sub-layer is the first refractive index layer with the first refractive index, and each the second sub-layer and the fourth sub-layer is the second refractive index layers with the second refractive index.

In some possible implementations, a thickness of the first sub-layer ranges from 40 nm to 140 nm, the thickness of the second sub-layer ranges from 40 nm to 220 nm, the thickness of the third sub-layer ranges from 40 nm to 140 nm, the thickness of the fourth sub-layer ranges from 40 nm to 220 nm, and the thickness of the fifth sub-layer ranges from 40 nm to 140 nm.

In some possible implementations, when the light modulation layer includes a first sub-layer, a second sub-layer, and a third sub-layer that are stacked.

Materials for the reflective layer includes aluminum, and the thickness of the first sub-layer ranges from 40 nm to 90 nm, the thickness of the second sub-layer ranges from 90 nm to 110 nm, and the thickness of the third sub-layer ranges from 40 nm to 90 nm; or the thickness of the first sub-layer ranges from 70 nm to 140 nm, the thickness of the second sub-layer ranges from 190 nm to 210 nm, and the thickness of the third sub-layer ranges from 70 nm to 140 nm.

Materials for the reflective layer includes molybdenum, the thickness of the first sub-layer ranges from 70 nm to 140 nm, the thickness of the second sub-layer ranges from 90 nm to 110 nm, and the thickness of the third sub-layer ranges from 70 nm to 140 nm; or the thickness of the first sub-layer ranges from 80 nm to 140 nm, the thickness of the second sub-layer ranges from 190 nm to 210 nm, and the thickness of the third sub-layer ranges from 80 nm to 140 nm.

In some possible implementations, within the visible light range, the first refractive index ranges from 1.6 to 2.5 and the second refractive index ranges from 1.3 to 1.5.

A display apparatus includes the above display substrate.

A preparation method for a display substrate includes: sequentially forming a light emitting unit layer and a mirror layer arranged on the light emitting unit layer on the base; and forming a light modulation layer configured to form a mirror display of a set color.

In some possible implementations, forming the light modulation layer includes: sequentially forming a first sub-layer, a second sub-layer and a third sub-layer on the mirror layer; or sequentially forming a first sub-layer, a second sub-layer, a third sub-layer, a fourth sub-layer and a fifth sub-layer on the mirror layer.

Each of the first sub-layer, the third sub-layer and the fifth sub-layer is the first refractive index layers with the first refractive index, and each of the second sub-layer and the fourth sub-layer is the second refractive index layer with the second refractive index, and the first refractive index is greater than the second refractive index.

In some possible implementations, forming the light modulation layer includes: sequentially forming a first sub-layer, a second sub-layer and a third sub-layer on a cover layer; or sequentially forming a first sub-layer, a second sub-layer, a third sub-layer, a fourth sub-layer and a fifth sub-layer on the cover layer; wherein each of the first sub-layer, the third sub-layer and the fifth sub-layer is the first refractive index layer with the first refractive index, each of the second sub-layer and the fourth sub-layer is the second refractive index layer with the second refractive index, and the first refractive index is greater than the second refractive index; and coating an optical adhesive layer on the mirror layer, and laminating the cover layer formed with the light modulation layer on the optical adhesive layer by a lamination process.

In some possible implementations, the light modulation layer is arranged on a surface at a side of the cover layer adjacent to the base, or the light modulation layer is arranged on a surface at a side of the cover layer away from the base.

In some possible implementations, the thickness of the first sub-layer ranges from 40 nm to 140 nm, the thickness of the second sub-layer ranges from 40 nm to 220 nm, the thickness of the third sub-layer ranges from 40 nm to 140 nm, the thickness of the fourth sub-layer ranges from 40 nm to 220 nm, and the thickness of the fifth sub-layer ranges from 40 nm to 140 nm.

After the accompanying drawings and detailed descriptions are read and understood, other aspects may be understood.

BRIEF DESCRIPTION OF DRAWINGS

Accompanying drawings are used to provide further understanding of technical solutions of the present disclosure, constitute a part of the specification, and are used to explain the technical solutions of the present disclosure together with embodiments of the present disclosure, thus do not constitute a limitation on the technical solutions of the present disclosure. The shapes and sizes of each component in the drawings do not reflect the true scale, but are only intended to schematically describe the contents of the present disclosure.

DESCRIPTION OF REFERENCE SIGNS

Figure 1:
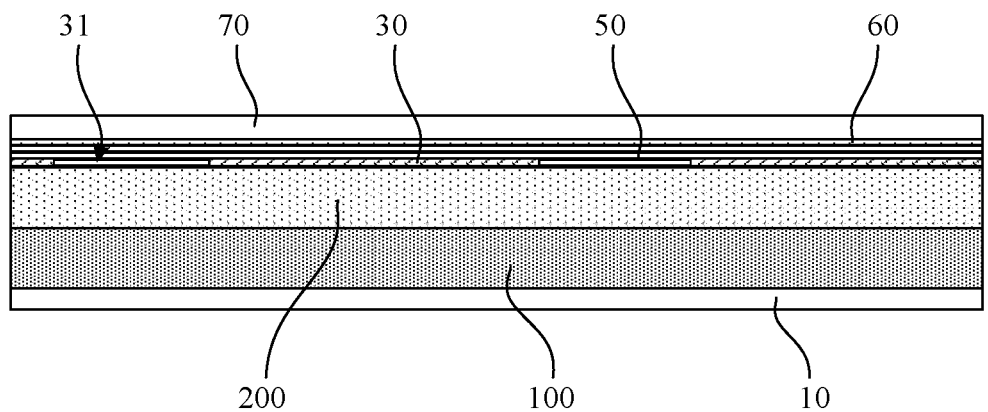
FIG. 1 is a schematic diagram of a structure of a display substrate according to an exemplary embodiment of the present disclosure.

| | | |
|---|---|---|
| 10-base; | 11-first insulation layer; | 12-second insulation layer; |
| 13-third insulation layer; | 14-fourth insulation layer; | 15-planarization layer; |
| 21-anode; | 22-pixel definition layer; | 23-organic light emitting layer; |
| 24-cathode; | 25-encapsulation structure layer | 30-reflective layer; |
| 31-light transmission hole; | 40-semi-transparent and semi-reflective layer; | |
| 50-light modulation layer; | | |
| 60-optical adhesive layer; | 70-cover layer; | 100-driving structure layer; |
| 101-transistor; | 102-storage capacitor; | 200-light emitting structure layer; |

DETAILED DESCRIPTION

Implementation modes herein may be implemented in multiple different forms. Those of ordinary skills in the art can readily appreciate a fact that the implementation modes and contents may be varied into various forms without departing from the spirit and scope of the present disclosure. Therefore, the present disclosure should not be construed as being only limited to the contents recorded in the following implementation modes. The embodiments in the present disclosure and features in the embodiments may be combined randomly with each other if there is no conflict.

In the accompanying drawings, a size of a constituent element, and a thickness or an area of a layer is sometimes exaggerated for clarity. Therefore, any one implementation mode of the present disclosure is not necessarily limited to dimensions shown in the drawings, and the shapes and sizes of the components in the accompanying drawings do not reflect actual scales. In addition, the accompanying drawings schematically show an ideal example, and any one implementation mode of the present disclosure is not limited to the shapes, values, or the like shown in the accompanying drawings.

Ordinal numerals such as "first", "second", and "third" herein are set to avoid confusion between constituent elements, but are not intended to limit in terms of quantity.

Herein, for convenience, wordings indicating orientations or positional relationships, such as "center", "upper", "lower", "front", "back", "vertical", "horizontal", "top", "bottom", "inside", "outside", and the like are used to describe the positional relationships between the constituent elements with reference to the accompanying drawings, and are merely for facilitating describing the implementation modes and simplifying the specification, rather than indicating or implying that the referred apparatuses or elements must have particular orientations, and be constructed and operated in particular orientations. Thus, they cannot be construed as a limitation on the present disclosure. The positional relationships between the constituent elements can be appropriately changed according to directions according to which the constituent elements are described. Therefore, appropriate replacements can be made according to situations without being limited to the wordings described in the specification, and.

Herein, unless otherwise specified and defined explicitly, terms "mount", "mutually connect", "connect" and the like should be understood in a broad sense. For example, a connection may be a fixed connection, or a detachable connection, or an integral connection, it may be a mechanical connection or an electrical connection, it may be a direct connection, or an indirect connection through an intermediate, or an internal communication between two elements. Those of ordinary skills in the art may understand meanings of the above terms in the present disclosure according to situations.

Herein, a transistor refers to an element at least including three terminals, i.e., a gate electrode, a drain electrode, and a source electrode. A transistor has a channel area between a drain electrode (or referred to as a drain electrode terminal, a drain region, or a drain electrode) and a source electrode (or referred to as a source electrode terminal, a source region, or a source electrode), and a current can flow through the drain electrode, the channel area, and the source electrode. Herein, the channel region refers to a region through which the current mainly flows.

Herein, a first electrode may be the drain electrode, and a second electrode may be the source electrode; or the first electrode may be the source electrode, and the second electrode may be the drain electrode. Herein, functions of the "source electrode" and the "drain electrode" are sometimes interchangeable with each other in a case that transistors with opposite polarities are used or a current direction changes during circuit operation. Therefore, the "source electrode" and the "drain electrode" are interchangeable herein.

Herein, an "electrical connection" includes a case that constituent elements are connected together by an element with a certain electrical effect. There is no specific restriction on the "element having some electrical function" as long as it may transmit and receive electrical signals between connected constituent elements. For example, "the elements with the certain electrical effect" may be electrodes or wirings, or switch elements, such as transistors, or other functional elements, such as resistors, inductors, capacitors, or the like.

Herein, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

Herein, "film" and "layer" may be interchangeable. For example, a "conductive layer" may sometimes be replaced with a "conductive film". Similarly, sometimes an "insulation film" may be replaced with an "insulation layer".

"About" herein refers to that a boundary is defined not so strictly and numerical values within process and measurement error ranges are allowed.

The disclosure provides a display substrate. The display substrate includes a light emitting unit layer arranged on a base and a mirror layer arranged on the light emitting unit layer. A light modulation layer is arranged on a side of the mirror layer away from the base and configured to form a mirror display of a set color.

In an exemplary embodiment, the light emitting unit layer includes multiple light emitting units corresponding to different colors. The mirror layer includes a reflective layer and light transmission holes corresponding to the multiple light emitting units one-to-one are arranged on the reflective layer.

In an exemplary embodiment, the light emitting unit layer includes multiple light emitting units corresponding to different colors, and the mirror layer includes a semi-transparent and semi-reflective layer.

In an exemplary embodiment, the display substrate further includes an optical adhesive layer and a cover layer. The light modulation layer is arranged on a surface at a side of the mirror layer away from the base. The optical adhesive layer is arranged on a surface at a side of the light modulation layer away from the base. The cover layer is arranged on a surface at a side of the optical adhesive layer away from the base.

In an exemplary embodiment, the display substrate further includes an optical adhesive layer and a cover layer. The cover layer is arranged on a side of the mirror layer away from the base. The light modulation layer is arranged on a surface at a side of the cover layer adjacent to the base. The optical adhesive layer is disposed between the mirror layer and the light modulation layer.

In an exemplary embodiment, the display substrate further includes an optical adhesive layer and a cover layer. The cover layer is arranged on a side of the mirror layer away from the base. The light modulation layer is arranged on a surface at a side of the cover layer away from the base. The optical adhesive layer is disposed between the mirror layer and the cover layer.

In an exemplary embodiment, the light modulation layer includes multiple sub-layers stacked. The multiple sub-layers include a first refractive index layer with a first refractive index and a second refractive index layer with a second refractive index. The first refractive index layer and the second refractive index layer are alternately arranged in the plurality of sub-layers.

In an exemplary embodiment, the first layer and the last layer are both first refractive index layers.

In an exemplary embodiment, the first refractive index is greater than the second refractive index.

In an exemplary embodiment, within the visible light range, the first refractive index may range from about 1.6 to 2.5, and the second refractive index may range from about 1.3 to 1.5.

In an exemplary embodiment, the light modulation layer includes a first sub-layer, a second sub-layer, and a third sub-layer which are stacked. Each of the first sub-layer and third sub-layer is the first refractive index layer with the first refractive index, and the second sub-layer is the second refractive index layer with the second refractive index.

In a possible exemplary embodiment, a thickness of the first sub-layer may range from about 40 nm to 140 nm, the thickness of the second sub-layer may range from about 40 nm to 220 nm, and the thickness of the third sub-layer may range from about 40 nm to 140 nm.

In a possible exemplary embodiment, when a material for the reflective layer is aluminum, the thickness of the first sub-layer ranges from about 40 nm to 90 nm, the thickness of the second sub-layer ranges from about 90 nm to 110 nm, and the thickness of the third sub-layer ranges from about 40 nm to 90 nm. Alternatively, the thickness of the first sub-layer ranges from 70 nm to 140 nm, the thickness of the second sub-layer ranges from 190 nm to 210 nm, and the thickness of the third sub-layer ranges from 70 nm to 140 nm.

In a possible exemplary embodiment, when the material for the reflective layer is molybdenum, the thickness of the first sub-layer ranges from about 70 nm to 140 nm, the thickness of the second sub-layer ranges from about 90 nm to 110 nm, and the thickness of the third sub-layer ranges from about 70 nm to 140 nm. Alternatively, the thickness of the first sub-layer ranges from 80 nm to 140 nm, the thickness of the second sub-layer ranges from 190 nm to 210 nm, and the thickness of the third sub-layer ranges from 80 nm to 140 nm.

In an exemplary embodiment, the light modulation layer includes a first sub-layer, a second sub-layer, a third sub-layer, a fourth sub-layer and a fifth sub-layer which are stacked. Each of the first sub-layer, the third sub-layer and the fifth sub-layer are the first refractive index layer with the first refractive index, and each of the second sub-layer and the fourth sub-layer are the second refractive index layer with the second refractive index.

In a possible exemplary embodiment, the thickness of the first sub-layer ranges from about 40 nm to 140 nm, the thickness of the second sub-layer ranges from about 40 nm to 220 nm, the thickness of the third sub-layer ranges from about 40 nm to 140 nm, the thickness of the fourth sub-layer ranges from about 40 nm to 220 nm, and the thickness of the fifth sub-layer ranges from about 40 nm to 140 nm.

In an exemplary embodiment, a material for the first refractive index layer may include any one or more of the following: oxides and nitrides. The oxides may include any one or more of the following: titanium dioxide, zirconium dioxide, and niobium pentoxide. The nitrides may include silicon nitride.

In an exemplary embodiment, a material for the second refractive index layer may include any one or more of the following: silica, magnesium fluoride, hafnium oxide and alumina.

In an exemplary embodiment, the multiple sub-layers in the light modulation layer may be sequentially deposited in a plasma enhanced chemical vapor deposition (PECVD) manner.

In an exemplary embodiment, the light modulation layer of the present disclosure is a periodic multilayer film system, and its basic structure is the periodic multilayer film system $(LH)^S$ with $\lambda/8$ film layers added on each side of the multilayer film system $(LH)^S$, forming a $(0.5HL0.5H)^S$ periodic multilayer film system, namely $$\left(\frac{H}{2}L\frac{H}{2}\right)^S$$

wherein H is the first refractive index layer with the first refractive index (high refractive index), L is the second refractive index layer with the second refractive index (low refractive index), the first refractive index is greater than the second refractive index; S=1, 2, 3, . . . , N, which is the number of periods of the multilayer film system. For example, the periodic multilayer film system (0.5HL0.5H) represents three layers including the first refractive index layer, the second refractive index layer, and the first refractive index layer that are stacked. As another example, the periodic multilayer film system $(0.5HL0.5H)^2$ represents five layers including the first refractive index layer, the second refractive index layer, the first refractive index layer, the second refractive index layer, and the first refractive index layer that are stacked.

The $(0.5HL0.5H)^S$ periodic multilayer film system is based on the principle of multi-beam interference in which a beam in a certain wavelength range (wave band) is to have a high reflectivity and the beam deviating from the wavelength range (wave band) become a high transmittance, and its basic feature is that a series of layers with the high reflectivity are separated by a series of layers with the high transmittance. In an exemplary embodiment of the present disclosure, the light modulation layer may be referred to as the periodic multilayer film system that has the high reflectivity for light in the wave bands of a certain color and the high transmittance for light in other wave bands.

In an exemplary embodiment, the number of periods of the multilayer film system is set as S=1 to 10 given the thickness of the light modulation layer, the preparation time and the process realizability.

FIG. 1 is a schematic diagram of a structure of a display substrate according to an exemplary embodiment of the present disclosure, illustrating a mirror OLED structure of a reflective layer. As shown in FIG. 1, in an exemplary embodiment, a display substrate includes a base 10, a driving structure layer 100 arranged on the base 10, a light emitting structure layer 200 arranged on a surface at a side of the driving structure layer 100 away from the base 10, a reflective layer 30 arranged on a surface at a side of the light emitting structure layer 200 away from the base 10, a light modulation layer 50 arranged on a surface at a side of the reflective layer 30 away from the base 10, an optical adhesive layer 60 arranged on a surface at a side of the light modulation layer 50 away from the base 10, and a cover layer 70 arranged on a surface at a side of the optical adhesive layer 60 away from the base 10. The driving structure layer 100 and the light emitting structure layer 200 constitute a light emitting unit layer in the exemplary embodiment of the present disclosure.

In a plane parallel to the base, the light emitting unit layer includes multiple light emitting units disposed periodically corresponding to different colors. In an exemplary embodiment, multiple light emitting units may include a red light emitting unit that emits red light, a green light emitting unit that emits green light, and a blue light emitting unit that emits blue light. In some possible implementations, multiple light emitting units may include the red light emitting unit, the green light emitting unit, the blue light emitting unit and a white light emitting unit that emits white light.

In an exemplary embodiment, the driving structure layer 100 may include multiple thin film transistors and storage capacitors for forming a pixel driving circuit. In an exemplary embodiment, the driving structure layer may include a first insulation layer, a semiconductor layer, a second insulation layer, a first gate metal layer, a third insulation layer, a second gate metal layer, a fourth insulation layer, a source-drain metal layer, and a planarization layer sequentially arranged on the base 10.

In an exemplary embodiment, the light emitting structure layer may include an anode, a pixel definition layer, an organic light emitting layer, a cathode and a encapsulation structure layer.

In an exemplary embodiment, a light transmission hole 31 may be arranged on the reflective layer 30 of each light emitting unit. Positions of multiple light transmission holes 31 correspond to positions of the organic light emitting layers in the multiple light emitting units one-to-one.

In an exemplary embodiment, the light modulation layer 50 may include multiple sub-layers stacked and is configured to form a mirror display of the set color.

Exemplary descriptions are made below through a process for preparing a display substrate. "Patterning process" mentioned in the present disclosure includes photoresist coating, mask exposure, development, etching, photoresist stripping and the like for metal materials, inorganic materials or transparent conductive materials, and includes organic material coating, mask exposure, development and the like for organic materials. Any one or more of sputtering, evaporation and chemical vapor deposition may be used for deposition, any one or more of spray coating, spin coating and inkjet printing may be used for coating, and any one or more of dry etching and wet etching may be used for etching, which are not limited in the present disclosure. A "thin film" refers to a layer of thin film prepared with a material on a base using deposition, coating or other processes. If the "thin film" does not need the patterning process in the entire preparation process, the "thin film" may also be referred to as a "layer". If the "thin film" needs the patterning process in the entire preparation process, the "thin film" is referred to as the "thin film" before the patterning process and is referred to as the "layer" after the patterning process. The "layer" after the patterning process includes at least one "pattern". "A and B are arranged on the same layer" in the present disclosure means that A and B are formed simultaneously through the same single patterning process, and a "thickness" of the film layer is the dimension of the film layer in a direction perpendicular to the display substrate. In an exemplary embodiment of the present disclosure, "an orthogonal projection of A includes an orthogonal projection of B" means that a boundary of the orthogonal projection of B falls within a boundary of the orthogonal projection of A, or the boundary of the orthogonal projection of A overlaps with the boundary of the orthogonal projection of B.

In an exemplary embodiment, the process for preparing the display substrate includes the following operations.

(1) A base 10 is formed on a glass carrier plate 1. In an exemplary embodiment, forming the base 10 on the glass carrier plate 1 may include: coating a first flexible material thin film on the glass carrier plate 1 and forming a first flexible layer after being cured into a film; coating a second flexible material thin film on a surface at a side of the first flexible layer away from the glass carrier plate 1 and forming a second flexible layer after being cured into the film; and coating a third flexible material thin film on a surface at a side of the second flexible layer away from the glass carrier plate 1 and forming a third flexible layer after being cured into the film, and forming the flexible base 10 on the glass carrier plate 1. The base 10 includes the first flexible layer, the second flexible layer and the third flexible layer which are stacked.

In another exemplary embodiment, forming the base 10 on the glass carrier plate 1 may include: firstly coating the first flexible material thin film on the glass carrier plate 1 and forming the first flexible layer after being cured into the film; then depositing a first inorganic material thin film on the first flexible layer to form a first inorganic layer covering the first flexible layer; then depositing an amorphous silicon thin film on the first inorganic layer to form an amorphous silicon layer covering the first inorganic layer; then coating the second flexible material thin film on the amorphous silicon layer and forming the second flexible layer after being cured into the film; and then depositing a second inorganic material film on the second flexible layer to form a second inorganic layer covering the second flexible layer, forming the flexible base 10 on the glass carrier plate 1. The base 10 includes the first flexible layer, the first inorganic layer, a semiconductor layer, the second flexible layer and the second inorganic layer which are stacked.

In an exemplary embodiment, materials for the first, second and third flexible material thin films may use polyimide (PI), polyethylene terephthalate (PET), pressure sensitive adhesive (PSA) or surface-treated polymer soft films. Materials for the first and second inorganic material thin films may use silicon nitride (SiNx) or silicon oxide (SiOx), which are used to improve the water oxygen resistance of the base. The first and second inorganic layers are referred to as a first barrier layer and a second barrier layer. Materials for the semiconductor layer may use amorphous silicon (a-si).

In an exemplary implementation, the first flexible layer, the second flexible layer and the third flexible layer may use the same materials or different materials. In some possible implementations, the materials for the first flexible layer includes pressure-sensitive adhesive, and the materials for the second flexible layer and the third flexible layer include polyimide.

Figure 2:
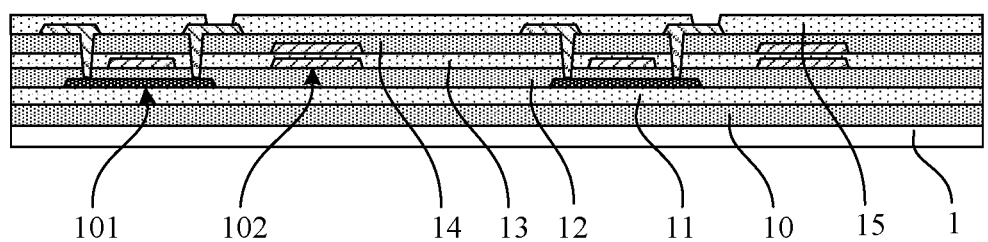
FIG. 2 is a schematic diagram of a formed pattern of a driving structure layer according to an exemplary embodiment of the present disclosure.

(2) A pattern of a driving structure layer is formed on the base 10, as shown in FIG. 2. In an exemplary embodiment, the driving structure layer may include multiple transistors and storage capacitors for forming a pixel driving circuit. FIG. 2 illustrates a driving structure layer of two sub-pixels. The driving structure layer of each sub-pixel is illustrated by taking one transistor and one storage capacitor as an example. In an exemplary embodiment, a process for preparing the driving structure layer may include the following operations.

A first insulation thin film and a semiconductor layer thin film are deposited sequentially on the base 10, and the semiconductor layer thin film is patterned through the patterning process to form a first insulation layer 11 covering the entire base 10, and a pattern of the semiconductor layer arranged on the first insulation layer 11. The pattern of the semiconductor layer at least includes an active layer disposed in each sub-pixel. In an exemplary embodiment, the present patterning process is referred to as a first patterning process.

Then, a second insulation thin film and a first metal thin film are deposited sequentially, and the first metal thin film is patterned through the patterning processes to form a second insulation layer 12 covering the pattern of the semiconductor layer, and a pattern of a first gate metal layer arranged on the second insulation layer 12. The pattern of the first gate metal layer at least includes a gate electrode and a first capacitor electrode disposed in each sub-pixel. In an exemplary embodiment, the present patterning process is referred to as a second patterning process.

Then, a third insulation thin film and a second metal thin film are deposited sequentially, and the second metal thin film is patterned through the patterning processes to form a third insulation layer 13 covering the first gate metal layer, and a pattern of a second gate metal layer arranged on the third insulation layer 13. The pattern of the second gate metal layer pattern at least include a second capacitor electrode disposed in each sub-pixel, and a position of the second capacitor electrode corresponds to that of the first capacitor electrode. In an exemplary embodiment, the present patterning process is referred to as a third patterning process.

Then, a fourth insulation thin film is deposited, and the fourth insulation thin film is patterned through the patterning processes to form a pattern of a fourth insulation layer 14 covering the second gate metal layer. Patterns of multiple vias are provided in the fourth insulation layer 14. The patterns of multiple vias at least include two first vias in each sub-pixel, and positions of the two first vias correspond to positions of two ends of the active layer, respectively. The fourth insulation layer 14, the third insulation layer 13 and the second insulation layer 12 in the two first vias are etched away to expose a surface of the active layer. In an exemplary embodiment, the present patterning process is referred to as a fourth patterning process.

Then, a third metal thin film is deposited, and the third metal thin film is patterned through the patterning process to form a pattern of a source-drain metal layer on the fourth insulation layer 14. The pattern of the source-drain metal layer at least includes a source electrode and a drain electrode disposed in each sub-pixel. The source electrode and the drain electrode are connected with the active layer through the first vias, respectively, so that a conductive channel is formed between the source electrode and the drain electrode. In an exemplary embodiment, the present patterning process is referred to as a fifth patterning process.

Then, a planarization film is coated to form a planarization (PLN) layer 15 covering the entire base 10, and patterns of the vias are formed on the planarization layer 15 through the patterning process. The patterns of the vias at least include a second via disposed in each sub-pixel. The planarization layer 15 in the second via is developed away to expose a surface of the drain electrode. In an exemplary embodiment, the present patterning process is referred to as a sixth patterning process.

So far, the pattern of the driving structure layer prepared on the base 10 is finished, as shown in FIG. 2. The active layer, the gate electrode, the source electrode, and the drain electrode form a transistor 101, and the first capacitance electrode and the second capacitance electrode form a storage capacitor 102. In an exemplary embodiment, the transistor 101 may be a drive transistor in the pixel driving circuit. The drive transistor may be a thin film transistor (TFT).

In an exemplary embodiment, the first insulation layer, the second insulation layer, the third insulation layer and the fourth insulation layer may use any one or more of silicon oxide (SiOx), silicon nitride (SiNx) and silicon oxynitride (SiON), and may be a single layer, multiple layers or a composite layer. The first insulation layer is referred to as a buffer layer, which is used to improve water oxygen resistance of the base. The second insulation layer and the third insulation layer are referred to as gate insulation (GI) layers. The fourth insulation layer is referred to as an interlayer insulation (ILD) layer. A flat thin film may use resin and the like. The first metal thin film, the second metal thin film and the third metal thin film may use metal materials, such as any one or more of silver (Ag), copper (Cu), aluminum (Al), titanium (Ti) and molybdenum (Mo), or alloy materials of the aforementioned metals, such as aluminum neodymium alloy (AlNd) or molybdenum niobium alloy (MoNb), and may be a single-layered structure or a multilayered composite structure, such as Ti/Al/Ti, etc. The active layer thin film may use materials, such as amorphous indium gallium zinc oxide (a-IGZO), zinc oxynitride (ZnON), indium zinc tin oxide (IZTO), amorphous silicon (a-Si), polycrystalline silicon (p-Si), hexathiophene, and polythiophene. Namely, the present disclosure is applicable to transistors prepared based on oxide technology, silicon technology and organic substances technology.

Figure 3:
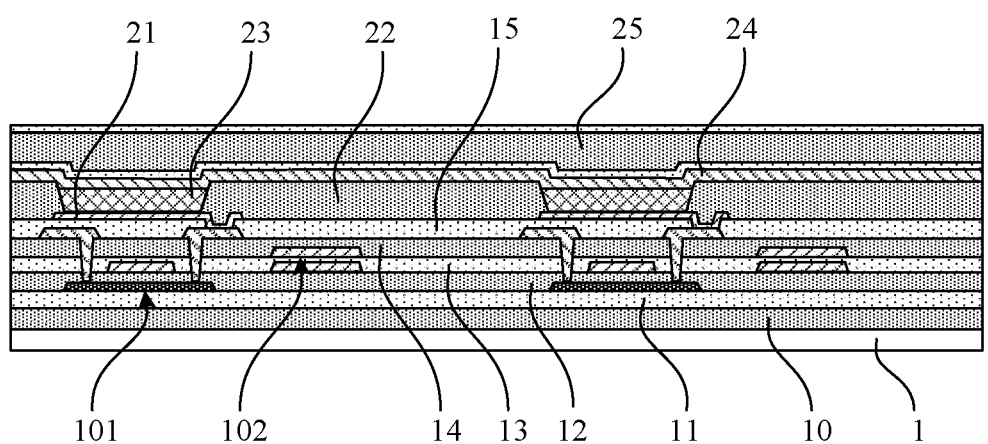
FIG. 3 is a schematic diagram of a formed pattern of a light emitting structure layer according to an exemplary embodiment of the present disclosure.

(3) A light emitting structure layer is formed on the driving structure layer, as shown in FIG. 3. In an exemplary embodiment, forming a light emitting structure layer on the driving structure layer may include the following operations.

A transparent conductive thin film is deposited on the base on which the above pattern is formed, and the transparent conductive thin film is patterned through the patterning process to form a pattern of a transparent conductive layer. The pattern of the transparent conductive layer at least includes an anode 21 disposed in each sub-pixel. The anode 21 is connected with the drain electrode of the first transistor 101 through the second via. In an exemplary embodiment, the present patterning process is referred to as a seventh patterning process. In an exemplary embodiment, the transparent conductive thin film may use indium tin oxide (ITO) or indium zinc oxide (IZO), may be a single layer structure, or a composite layer structure, such as ITO/Al/ITO.

A pixel definition thin film is coated on the base on which the above pattern is formed. The pixel definition thin film is subjected to mask exposure and development through the patterning process to form a pixel definition layer (PDL) 22. In each sub-pixel, the pixel definition layer 22 is provided with a pixel opening, and the pixel definition thin film in the pixel opening is developed away to expose the surface of the anode 21. In an exemplary embodiment, the present patterning process is referred to as an eighth patterning process. In an exemplary embodiment, the pixel definition thin film may use materials such as polyimide, acrylic, or polyethylene terephthalate.

An organic material thin film is coated on the base on which the above pattern is formed. The organic material thin film is subjected to mask exposure and development through the patterning process to form patterns of multiple photo spacers (PS). In an exemplary embodiment, the present patterning process is referred to as a ninth patterning process.

An organic light emitting layer 23 and a cathode 24 are sequentially formed on the base on which the above pattern is formed. The organic light emitting layer 23 is formed in the pixel opening in each sub-pixel to achieve the connection between the organic light emitting layer 23 and the anode 21. The cathode 24 is formed on the organic light emitting layer 23 and the pixel definition layer 22 to achieve the connection between the cathode 24 and the organic light emitting layer 23. The cathodes 24 of multiple sub-pixels are of an integrated structure. In an exemplary embodiment, the organic light emitting layer 23 may include a hole injection layer, a hole transport layer, a light emitting layer, an electron transport layer, and an electron injection layer which are stacked.

An encapsulation structure layer 25 is formed on the base on which the above pattern is formed. In an exemplary embodiment, the encapsulation structure layer 25 may use a stacked structure of an inorganic material/an organic material/an inorganic material, and an organic material layer is disposed between two inorganic material layers. In an exemplary embodiment, a process for forming the encapsulation structure layer 25 may include the following operations.

A first inorganic thin film is deposited by plasma enhanced chemical vapor deposition (PECVD) through an open mask to form a first encapsulation layer. Since the open mask blocks the bonding area, the first encapsulation layer exposes the bonding pad of the bonding area. The plasma enhanced chemical vapor deposition is a low-temperature process, and an operating temperature is about 80 degrees centigrade. Then, an organic material is inkjet printed on the first encapsulation layer through an inkjet printing process, and a second encapsulation layer is formed after being cured into a film. Since the ink jet printing process is adopted, a second encapsulation layer may be formed only in the display area. Then, a second inorganic thin film is deposited by using the open mask to form a third encapsulation layer. In an exemplary embodiment, the first encapsulation layer and the third encapsulation layer may use any one or more of the following: silicon oxide (SiOx), silicon nitride (SiNx), and silicon oxynitride (SiON), and may be single-layer, multilayer, or composite layer. The second encapsulation layer may use resin materials. In an exemplary embodiment, a thickness of the first encapsulation layer may range from about 0.8 μm to 1.2 μm, the thickness of the second encapsulation layer may range from about 10 μm to 15 μm, and the thickness of the third encapsulation layer may range from about 0.5 μm to 0.7 μm. In some possible implementations, the thickness of the first encapsulation layer may be about 1 μm, the thickness of the second encapsulation layer may be about 12 μm, and the thickness of the third encapsulation layer may be about 0.6 μm.

So far, the pattern of the light emitting structure layer prepared on the driving structure layer is finished, as shown in FIG. 3.

Figure 4:
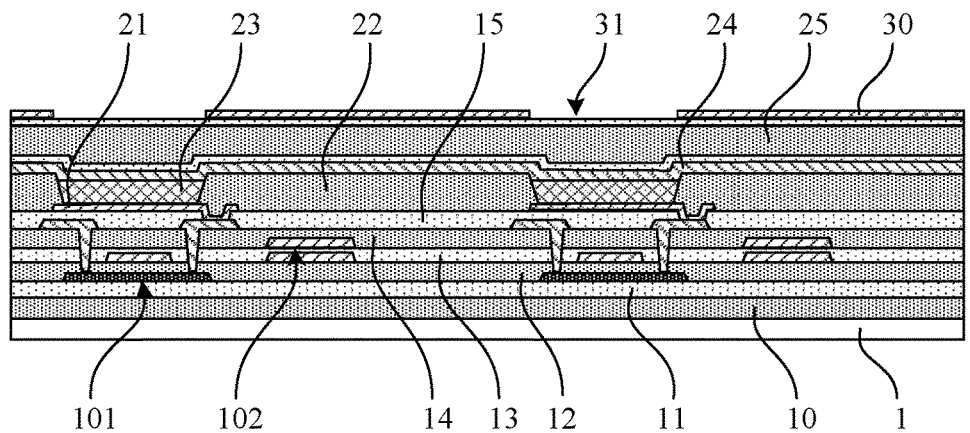
FIG. 4 is a schematic diagram of a formed pattern of a reflective layer according to an exemplary embodiment of the present disclosure.

(4) A reflective layer is formed on the emitting structure layer. In an exemplary embodiment, forming the reflective layer on the light emitting structure layer may include the following operations. A reflective thin film is deposited on the base on which the above pattern is formed. The reflective thin film is patterned by the patterning process to form a pattern of the reflective layer. The pattern of the reflective layer at least includes the reflective layer 30 disposed in the encapsulation structure layer 25 and a light transmission hole 31 disposed in each sub-pixel, and position of the light transmission hole 31 corresponds to position of the pixel opening of the light emitting structure layer, as shown in FIG. 4. In an exemplary embodiment, this patterning process is referred to as a tenth patterning process.

In an exemplary embodiment, an area of the light transmission hole 31 on the reflective layer 30 may range from about 10% to 40% of that of the sub-pixels. That is, on a plane parallel to the display substrate, an area of an orthographic projection of the reflective layer 30 on the base ranges from about 60% to 90% of that of the sub-pixels. In an exemplary embodiment, the orthographic projection of the light transmission hole 31 on the base may be greater, equal to or less than the orthographic projection of the pixel opening on the base. When the orthographic projection of the light transmission hole 31 on the base is larger than the orthographic projection of the pixel opening on the base, the area of the light transmission hole 31 is larger than the area of the light emitting region, and the display brightness is improved, but the mirror effect is weakened. When the orthographic projection of the light transmission hole 31 on the base is smaller than the orthographic projection of the pixel opening on the base, the area of the light transmission hole 31 is smaller than the area of the light emitting region, and the mirror effect is enhanced, but the display brightness is weakened. In an exemplary embodiment, the area of the light emitting region is the area of the pixel opening.

In an exemplary embodiment, a shape of the light transmission hole 31 may be a square shape, rectangular shape, circular shape, elliptical shape or hexagonal shape, and may be set according to actual needs, which are not limited in the present disclosure.

In an exemplary embodiment, the reflective layer 30 forming the mirror effect may be a single-layer structure or a multilayer structure. A material for the single-layer structure may include any one or more of the following: molybdenum (MO), aluminum (Al), and titanium (Ti). A material for the multilayer structure may include Ti/Al/Ti or ITO/Ag/ITO.

In an exemplary embodiment, a thickness of the reflective layer 30 may range from about 0.10 μm to 0.70 μm. In some possible implementations, the thickness of the reflective layer ranges from 0.30 μm to 0.40 μm.

In an exemplary embodiment, the orthographic projection of the reflective layer 30 on the base includes the orthographic projection of the encapsulation structure layer 25 on the base, so that the encapsulation structure layer 25 is covered by the reflective layer 30, improving the mirror effect.

Figure 5:
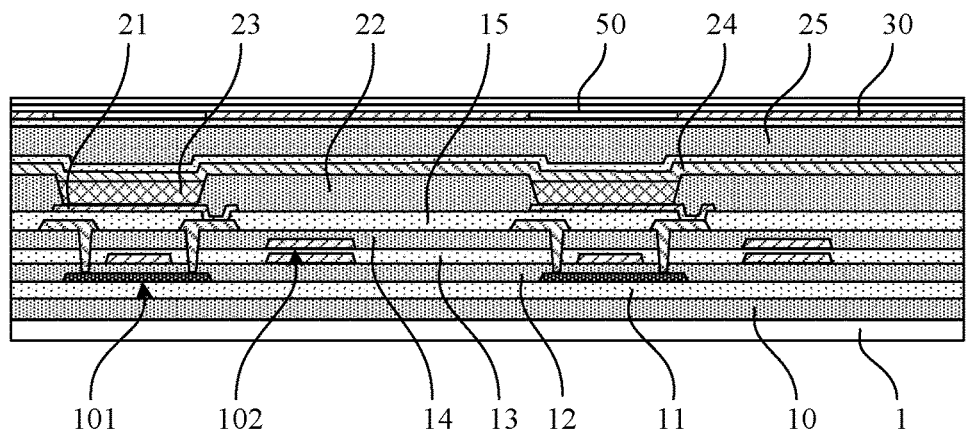
FIG. 5 is a schematic diagram of a formed pattern of a light modulation layer according to an exemplary embodiment of the present disclosure.

(5) A light modulation layer is formed on the reflective layer. In an exemplary embodiment, forming the light modulation layer on the reflective layer may include alternately forming multiple first refractive index layers and second refractive index layers on the base on which the above pattern is formed, and forming the light modulation layer 50 on the protection layer as shown in FIG. 5.

In an exemplary embodiment, the light modulation layer may be referred to as the periodic multilayer film system. The light modulation layer 50 includes multiple sub-layers formed sequentially. The multiple sub-layers include the first refractive index layer with the first refractive index and the second refractive index layer with the second refractive index. The first refractive index layer and the second refractive index layer are alternately arranged in the plurality of sub-layers. The first refractive index is greater than the second refractive index.

In an exemplary embodiment, both the first layer and the last layer in the multiple sub-layers are first refractive index layers.

In an exemplary embodiment, the light modulation layer 50 may include three sub-layers, five sub-layers, seven sub-layers, nine sub-layers or eleven layers. The number of sub-layers is odd.

In an exemplary embodiment, the light modulation layer 50 may include the first sub-layer, the second sub-layer, and the third sub-layer formed sequentially on the protection layer. Each of the first sub-layer and the third sub-layer is the first refractive index layer with the first refractive index. The second sub-layer is the second refractive index layer with the second refractive index.

In an exemplary embodiment, the thickness of the first sub-layer may range from about 40 nm to 140 nm, the thickness of the second sub-layer may range from about 80 nm to 120 nm, and the thickness of the third sub-layer may range from about 40 nm to 140 nm.

In an exemplary embodiment, the thickness of the first sub-layer may range from about 40 nm to 90 nm, the thickness of the second sub-layer may range from about 40 nm to 220 nm, and the thickness of the third sub-layer may range from about 40 nm to 90 nm.

In an exemplary embodiment, when the material for the reflective layer is metal aluminum, the thickness of the first sub-layer may range from about 40 nm to 90 nm, the thickness of the second sub-layer may range from about 90 nm to 110 nm, and the thickness of the third sub-layer may range from about 40 nm to 90 nm.

Figure 6:
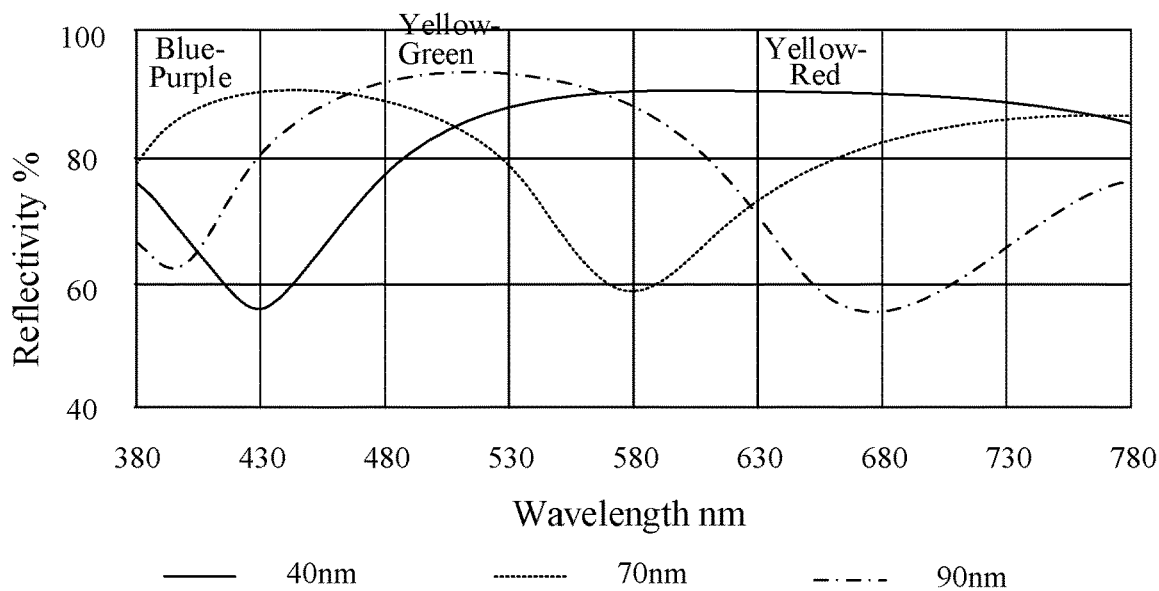
FIG. 6 is a diagram of simulation results of a light modulation layer reflecting different colors according to an exemplary embodiment of the present disclosure.

FIG. 6 is a diagram of simulation results of a light modulation layer reflecting different colors according to an exemplary embodiment of the present disclosure. The material for the reflective layer is metal aluminum with a thickness of 330 nm and the thickness of the second sub-layer is 100 nm. When the thicknesses of the first sub-layer and the third sub-layer are about 40 nm, a reflectivity of light with a wavelength greater than 500 nm is greater than 80%, and the mirror surface displays yellow-red, as shown by solid lines in FIG. 6. When the thicknesses of the first sub-layer and the third sub-layer are about 70 nm, the reflectivity of light with the wavelength less than 530 nm is greater than 80%, and the mirror surface displays blue-purple, as shown by dotted lines in FIG. 6. When the thicknesses of the first sub-layer and the third sub-layer are about 90 nm, the reflectivity of light with the wavelength greater than 430 nm and less than 600 nm is greater than 80%, and the mirror surface displays yellow-green, as shown by dashed lines in FIG. 6.

In an exemplary embodiment, when the material for the reflective layer is metal molybdenum, the thickness of the first sub-layer may range from about 70 nm to 140 nm, the thickness of the second sub-layer may range from about 90 nm to 110 nm, and the thickness of the third sub-layer may range from about 70 nm to 140 nm.

Figure 7:
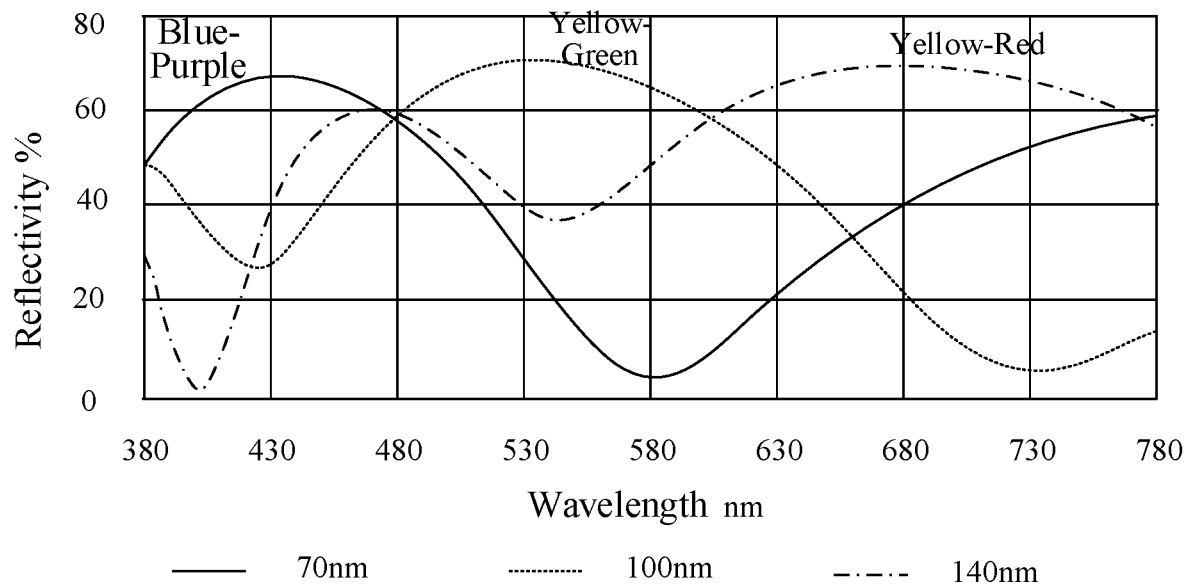
FIG. 7 is a diagram of simulation results of another light modulation layer reflecting different colors according to an exemplary embodiment of the present disclosure.

FIG. 7 is a diagram of simulation results of another light modulation layer reflecting different colors according to an exemplary embodiment of the present disclosure. The material for the reflective layer is metal molybdenum with a thickness of 330 nm and the thickness of the second sub-layer is 100 nm. When the thicknesses of the first sub-layer and the third sub-layer are about 70 nm, a reflectivity of light with a wavelength less than 480 nm is greater than 60%, and the mirror surface displays blue-purple, as shown by solid lines in FIG. 7. When the thicknesses of the first sub-layer and the third sub-layer range from about 90 nm to 110 nm, the reflectivity of light with the wavelength greater than 480 nm and less than 600 nm is greater than 60%, and the mirror surface displays yellow-green, as shown by dotted lines in FIG. 7. When the thicknesses of the first sub-layer and the third sub-layer are about 140 nm, the reflectivity of light with the wavelength greater than 600 nm is greater than 60%, and the mirror surface displays yellow-red, as shown by dashed lines in FIG. 7.

In an exemplary embodiment the thickness of the first sub-layer with the first refractive index may be less than the thickness of the second sub-layer with the second refractive index. In some possible implementations, the thickness of the first sub-layer may range from about 70 nm to 140 nm, the thickness of the second sub-layer may range from about 180 nm to 220 nm, and the thickness of the third sub-layer may range from about 70 nm to 140 nm.

In an exemplary embodiment, when the material for the reflective layer is metal aluminum, the thickness of the first sub-layer may range from about 70 nm to 140 nm, the thickness of the second sub-layer may range from about 190 nm to 210 nm, and the thickness of the third sub-layer may range from about 70 nm to 140 nm.

In some possible implementations, in the case that the material for the reflective layer is metal aluminum and the thickness of the second sub-layer is 200 nm, the mirror surface displays blue-purple when the thickness of the first sub-layer and the third sub-layer are about 70 nm, and the mirror surface displays yellow-green when the thickness of the first sub-layer and the third sub-layer is about 120 nm.

In an exemplary embodiment, when the material for the reflective layer is metal molybdenum, the thickness of the first sub-layer may range from about 80 nm to 140 nm, the thickness of the second sub-layer may range from about 190 nm to 210 nm, and the thickness of the third sub-layer may range from about 80 nm to 140 nm.

In some possible implementations, in the case that the material for the reflective layer is metal molybdenum and the thickness of the second sub-layer is 200 nm, the mirror surface displays blue-purple when the thickness of the first sub-layer and the third sub-layer is about 80 nm; and the mirror surface displays yellow-green when the thickness of the first sub-layer and the third sub-layer is about 140 nm.

In an exemplary embodiment, the light modulation layer 50 may include the first sub-layer, the second sub-layer, the third sub-layer, the fourth sub-layer, and the fifth sub-layer formed sequentially on the reflective layer. Each of the first sub-layer, the third sub-layer, and the fifth sub-layer is the first refractive index layer with the first refractive index, and each of the second sub-layer and the fourth sub-layer is the second refractive index layer with the second refractive index.

In an exemplary embodiment, the thickness of the first sub-layer may range from about 40 nm to 140 nm, the thickness of the second sub-layer may range from about 80 nm to 120 nm, the thickness of the third sub-layer may range from about 40 nm to 140 nm, the thickness of the fourth sub-layer may range from about 80 nm to 120 nm, and the thickness of the fifth sub-layer may range from about 40 nm to 140 nm.

In another exemplary embodiment, the thickness of the first sub-layer may range from about 40 nm to 90 nm, the thickness of the second sub-layer may range from about 40 nm to 220 nm, the thickness of the third sub-layer may range from about 40 nm to 90 nm, the thickness of the fourth sub-layer may range from about 40 nm to 220 nm, and the thickness of the fifth sub-layer may range from about 40 nm to 90 nm.

Figure 8:
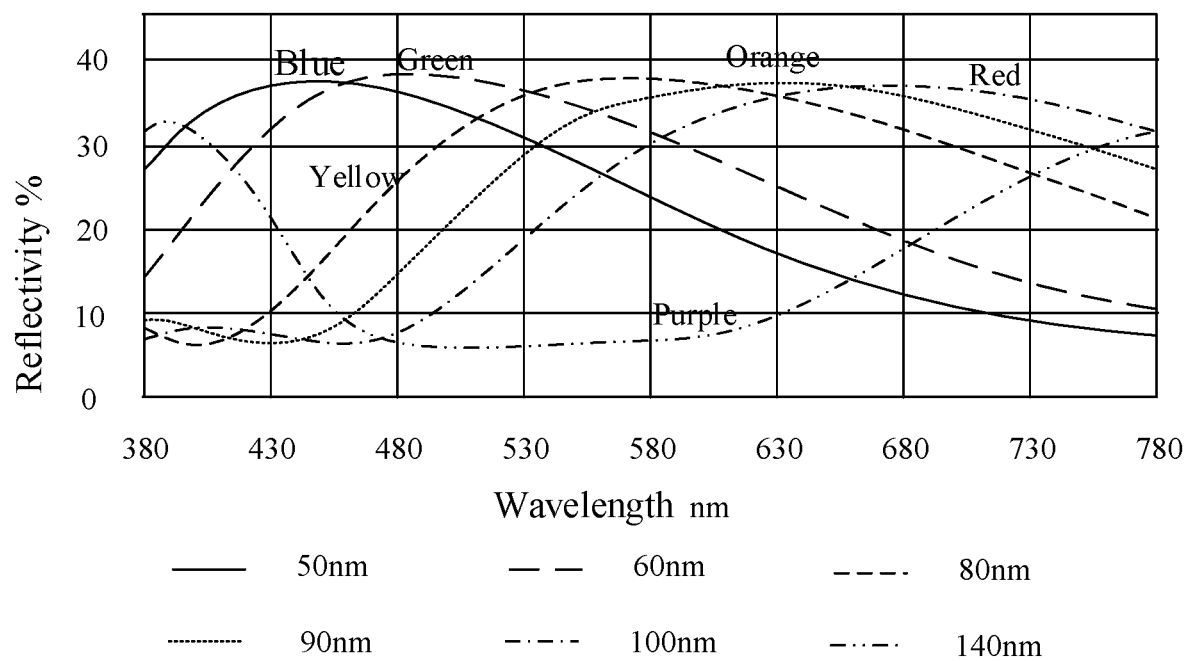
FIG. 8 is a diagram of simulation results of a first refractive index layer reflecting different colors according to an exemplary embodiment of the present disclosure.

FIG. 8 is a diagram of simulation results of a first refractive index layer reflecting different colors according to an exemplary embodiment of the present disclosure. When the thickness of the first refractive index layer is about 50 nm, a reflectivity of light with a wavelength greater than 400 nm and less than 500 nm is greater than 35%, and a mirror surface displays blue, as shown by solid lines in FIG. 8. When the thickness of the first refractive index layer is about 60 nm, the reflectivity of light with the wavelength greater than 450 nm and less than 550 nm is greater than 35%, and the mirror surface displays green, as shown by long dashed lines in FIG. 8. When the thickness of the first refractive index layer is about 80 nm, the reflectivity of light with the wavelength greater than 530 nm and less than 630 nm is greater than 35%, and the mirror surface displays yellow, as shown by short dashed lines in FIG. 8. When the thickness of the first refractive index layer is about 90 nm, the reflectivity of light with the wavelength greater than 580 nm and less than 680 nm is greater than 35%, and the mirror surface displays orange, as shown by dotted dashed lines in FIG. 8. When the thickness of the first refractive index layer is about 100 nm, the reflectivity of light with the wavelength greater than 630 nm and less than 730 nm is greater than 35%, and the mirror surface displays red, as shown by dashed lines in FIG. 8. When the thickness of the first refractive index layer is about 140 nm, the reflectivity of light with the wavelength less than 400 nm is greater than 30%, and the mirror surface displays purple, as shown by double dashed lines in FIG. 8. In an exemplary embodiment, the colors displayed by the mirror surface may be adjusted by changing the thickness of the high refractive index layer. In some possible implementations, the colors displayed by the mirror surface may be fine-tuned by changing the thickness of the low refractive index layer.

In an exemplary embodiment, within the visible light range, the first refractive index may range from about 1.6 to 2.5, and the second refractive index may range from about 1.3 to 1.5.

In an exemplary embodiment, the material for the first refractive index layer may include any one or more of the following: oxides and nitrides.

In an exemplary embodiment, the oxide may include any one or more of the following: titanium dioxide, zirconium dioxide and niobium pentoxide.

In an exemplary embodiment, the nitride may include silicon nitride.

In an exemplary embodiment, a material for the second refractive index layer may include any one or more of the following: silica, magnesium fluoride, hafnium oxide and alumina.

In an exemplary embodiment, considering that silicon nitride and silicon dioxide are used in the process for preparing the driving structure layer, the material for the first refractive index layer may use silicon nitride, and the material for the second refractive index layer may use silica. Since there is no need to introduce new equipment and materials, the cost of silicon nitride and silica is low, the setting of the light modulation layer will not greatly increase the cost of the display substrate.

In an exemplary embodiment, the multiple sub-layers in the light modulation layer 50 may be sequentially deposited in the manner of plasma enhanced chemical vapor deposition (PECVD). The process may be simplified through sequential deposition using the same deposition manner. There is no need to constantly switch equipment during the deposition process which leads to process complexity. In some possible implementations, the multiple sub-layers in the light modulation layer 50 may be sequentially evaporated in an evaporation manner or may be sequentially deposited in a manner of chemical vapor deposition (CVD).

Figure 9:
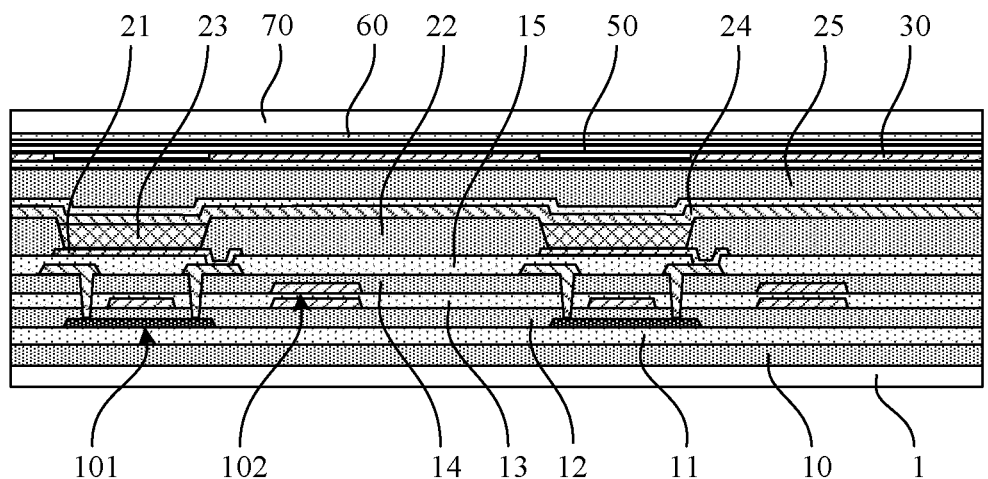
FIG. 9 is a schematic diagram of a formed cover layer according to an exemplary embodiment of the present disclosure.

(7) A cover layer is formed on the light modulation layer. In an exemplary embodiment, forming the cover layer on the light modulation layer may include the following operations. The cover layer 70 is laminated on the light modulation layer 50 using an optical adhesive layer 60, as shown in FIG. 9. In an exemplary embodiment, the cover layer may use a glass cover or a film cover, which may be laminated using a lamination process. For example, a layer of the optical adhesive layer 60 is first coated on the light modulation layer 50, and then the glass cover plate or the film cover plate is laminated on the optical adhesive layer 60 by the lamination process. In an exemplary embodiment, a thickness of the optical adhesive layer 60 may range from about 40 μm to 60 μm, and the thickness of the cover layer 70 may range from about 100 μm to 700 μm. In some possible implementations, the thickness of the optical adhesive layer 60 may be about 50 μm and the thickness of the cover layer 70 may be about 500 μm.

So far, the preparation of the display substrate is completed, as shown in FIG. 9. In an exemplary embodiment, the display substrate prepared by the aforementioned preparation process may include: a base 10, a first insulation layer 11, a semiconductor layer, a second insulation layer 12, a first gate metal layer, a third insulation layer 13, a second gate metal layer, a first gate metal layer, a third insulation layer 13, a second gate metal layer, a first gate metal layer, a third insulation layer 13, a second gate metal layer, a fourth insulation layer 14, a source-drain metal layer, a planarization layer 15, a transparent conductive layer, a pixel definition layer 22, an organic light emitting layer 23, a cathode 24, an encapsulation structure layer 25, a reflective layer 30, a light modulation layer 50, and a cover layer 70.

The first insulation layer 11 is arranged on the base 10.

The semiconductor layer is arranged on the first insulation layer 11, and the semiconductor layer includes at least an active layer disposed in each sub-pixel.

The second insulation layer 12 covers the semiconductor layer.

The first gate metal layer is arranged on the second insulation layer 12, and the first gate metal layer includes at least a first gate electrode and a first capacitor electrode disposed in each sub-pixel.

The third insulation layer 13 covers the first metal gate layer.

The second gate metal layer is arranged on the third insulation layer 13, the second gate metal layer includes at least a gate electrode and a second capacitor electrode disposed in each sub-pixel, position of the second capacitor electrode corresponds to position of the first capacitor electrode.

The fourth insulation layer 14 covers the second gate metal layer, and at least two first vias are formed on the fourth insulation layer 14 in each sub-pixel, and the first vias expose the first active layer.

The source-drain metal layer is arranged on the fourth insulation layer 14, and the source-drain metal layer at least includes a source electrode and a drain electrode disposed in each sub-pixel, and the source electrode and the drain electrode are connected with the active layer through the first vias, respectively, so that a conductive channel is formed between the source electrode and the drain electrode.

The planarization layer 15 covers the source-drain metal layers, and a second via hole is formed on the planarization layer 15 in each sub-pixel, and the second via exposes the drain electrode.

The transparent conductive layer is arranged on the planarization layer 15, the transparent conductive layer includes at least an anode 21 provided in each sub-pixel, and the anode 21 is connected with the drain electrode through the second via.

The pixel definition layer 22 is arranged on the planarization layer 15, pixel openings are arranged on the pixel definition layer 22 in each sub-pixel, and the pixel openings expose a surface of the anode 21.

The organic light emitting layer 23 is arranged in the pixel openings of each sub-pixel, and the organic light emitting layer 23 being connected with the anode 21.

The cathode 24 is arranged on the organic light emitting layer 23, and the cathode 24 is connected with the organic light emitting layer 23;

The encapsulation structure layer 25 covers the cathode 24, and the encapsulation structure layer 25 includes a first encapsulation layer, a second encapsulation layer and a third encapsulation layer which are stacked, and the first encapsulation layer and the third encapsulation layer are made of the inorganic materials, and the second encapsulation layer is made of the organic materials.

The reflective layer 30 is arranged on the encapsulation structure layer 25, and the reflective layer 30 in each sub-pixel is provided with a light transmission hole 31, and position of the light transmission hole 31 corresponds to position of the pixel opening.

The light modulation layer 50 covers the reflective layer 30, and the light modulation layer 50 is configured to form a mirror display of a set color.

The cover layer 70 is laminated to the light modulation layer 50 by an optical adhesive layer 60.

When preparing the flexible display substrate, the preparation process of the display substrate may further include processes, such as stripping of the glass carrier plate 1, adhesion of a back film, and cutting, which are not limited in the present disclosure.

In a display panel, since external light is reflected by a metal cathode, which affects the contrast and display effect, a circular polarizer is required to avoid external light reflection. Large light brightness loss, high power consumption and short service life are caused by the setting of the circular polarizer with light absorption and orientation. The research shows that the transmittance of the circular polarizer is about 45%. Exemplary embodiments of the present disclosure provide the setting a light modulation layer in a mirror OLED display substrate. Light having diverse colors can be selectively reflected using the light modulation layer designed by the optical interference theory, and high transmittance of light during display can be ensured, which not only achieves mirror display of diverse colors, but also the reflectivity of the formed color mirror is close to that of the circular polarizer, and has the characteristics of low reflectivity and effectively avoids external light reflection. The formed color mirror display substrate cannot be disposed with the circular polarizer, thus greatly reducing light loss. Exemplary embodiments of the present disclosure can not only reduce power consumption but also increase service life under the same luminance condition. Further, the preparation of the display substrate of the exemplary embodiments of the present disclosure does not increase the number of patterning, does not need to increase process devices, and has good process compatibility and strong practicability.

The display substrate provided by the exemplary embodiments of the present disclosure can not only allow a display screen of a mirror OLED to show different colors and have more fashion, but also make the outdoor application of the mirror OLED unlimited, have more comfortable scene application and the richer decorative functions by setting the light modulation layer in the mirror display substrate. The display substrate provided by the exemplary embodiments of the present disclosure can be applicable to not only mobile phones, electronic terminals, wearable display apparatus, vehicle rearview mirror, ATM cash machine display screen, advertising device and home appliance display device and the like, but also home appliance displays of smart homes, such as cosmetic displays or refrigerator displays, which has a good application prospect.

The structure and its preparing process in the exemplary embodiments of the present disclosure are only exemplarily described. In an exemplary embodiment, the corresponding structure may be changed and the patterning process may be added or reduced according to actual needs. For example, a transistor in the driving structure layer may be a top gate structure or a bottom gate structure, or may be a single-gate structure or a double-gate structure. As another example, other film layer structures, electrode structures, or lead structures may further be disposed in the driving structure layer and the light emitting structure layer. As a further example, the base may be a glass base, which is not specifically limited in the present disclosure.

Figure 10:
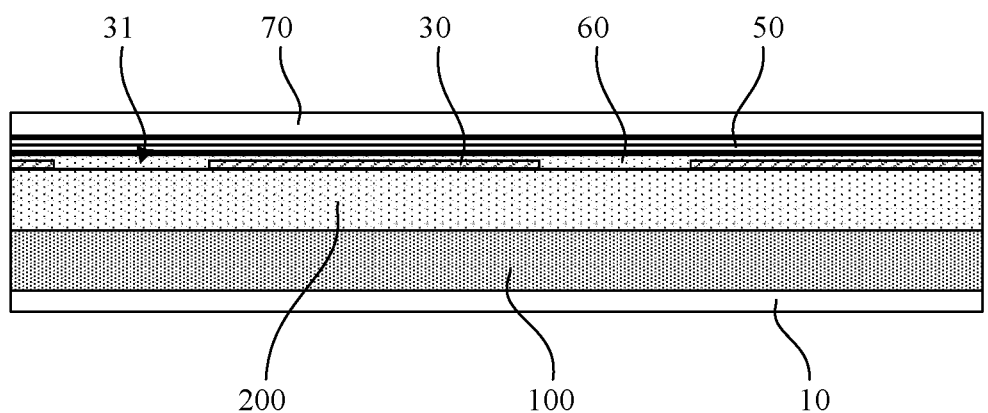
FIG. 10 is a schematic diagram of a structure of another display substrate according to an exemplary embodiment of the present disclosure.

FIG. 10 is a schematic diagram of a structure of another display substrate according to an exemplary embodiment of the present disclosure, which illustrates a structure of mirror OLED. As shown in FIG. 10, in an exemplary embodiment, a display substrate includes a base 10, a driving structure layer 100 arranged on a surface at a side of the base 10 away from the base 10, a light emitting structure layer 200 arranged on a surface at a side of the driving structure layer 100 away from the base 10, a reflective layer 30 arranged on a surface at a side of the light emitting structure layer 200 away from the base 10, an optical adhesive layer 60 arranged on a surface at a side of the reflective layer 30 away from the base 10, a light modulation layer 50 arranged on a surface at a side of the optical adhesive layer 60 away from the base 10, and a cover layer 70 arranged on a surface at a side of the light modulation layer 50 away from the base 10. In an exemplary embodiment, the light modulation layer 50 is arranged on a surface at a side of the cover layer 70 adjacent to the base 10. The structures of the driving structure layer 100, the light emitting structure layer 200, the reflective layer 30, and the light modulation layer 50 may be similar to the corresponding structures described in the foregoing embodiments.

In an exemplary embodiment, the preparation process of the display substrate may include two portions which are not required to perform at a certain order, and may be performed simultaneously. One portion is to sequentially prepare a base, a driving structure layer, a light emitting structure layer and a reflective layer on a glass carrier plate and the preparation process may be similar to the preparation process described in the previous embodiments. The other portion is to provide a cover layer, such as a glass cover plate or a thin film cover plate, and then sequentially deposit multiple sub-layers through a low-temperature deposition process to form a light modulation layer on the cover layer. After completing the preparation of the two portions, an optical adhesive layer is first coated on the reflective layer, and then a surface at a side of the cover layer formed with the light modulation layer is laminated on the optical adhesive layer by the lamination process to complete the preparation of the display substrate.

Figure 11:
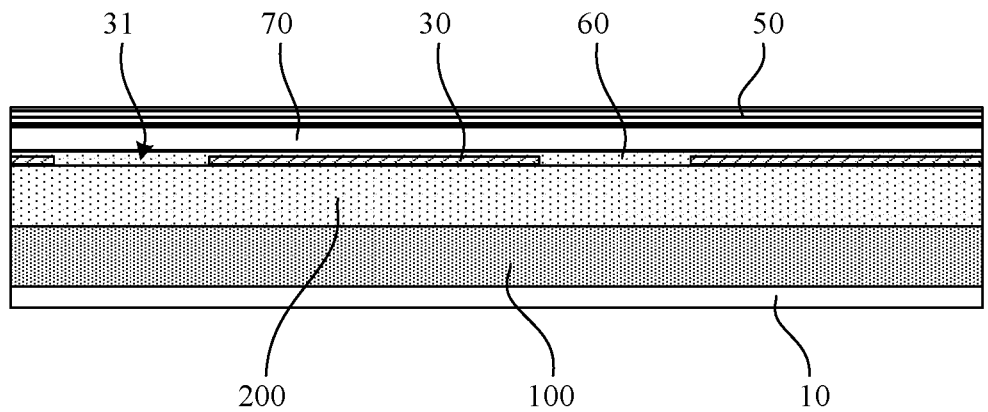
FIG. 11 is a schematic diagram of a structure of yet another display substrate according to an exemplary embodiment of the present disclosure.

FIG. 11 is a schematic diagram of a structure of yet another display substrate according to an exemplary embodiment of the present disclosure, which illustrates a structure of mirror OLED. As shown in FIG. 11, in an exemplary embodiment, a display substrate includes a base 10, a driving structure layer 100 arranged on a surface at a side of the base 10 away from the base 10, a light emitting structure layer 200 arranged on a surface at a side of the driving structure layer 100 away from the base 10, a reflective layer 30 arranged on a surface at a side of the light emitting structure layer 200 away from the base 10, an optical adhesive layer 60 arranged on a surface at a side of the reflective layer 30 away from the base 10, a cover layer 70 arranged on a surface at a side of the optical adhesive layer 60 away from the base 10, and a light modulation layer 50 arranged on a surface at a side of the cover layer 70 away from the base 10. In an exemplary embodiment, the light modulation layer 50 is arranged on a surface at a side of the cover layer 70 away from the base 10. The structures of the driving structure layer 100, the light emitting structure layer 200, the reflective layer 30, and the light modulation layer 50 may be similar to the corresponding configurations described in the foregoing embodiments.

In an exemplary embodiment, the preparation process of the display substrate may include two portions which are not required to perform at a certain order, and may be performed simultaneously. One portion is to sequentially prepare a base, a driving structure layer, a light emitting structure layer and a reflective layer on a glass carrier plate and the preparation process may be similar to the preparation process described in the previous embodiments. The other portion is to provide a cover layer, such as a glass cover plate or a thin film cover plate, and then sequentially deposit multiple sub-layers through a low-temperature deposition process to form a light modulation layer on the cover layer. After completing the preparation of the two portions, an optical adhesive layer is first coated on the reflective layer, and then a surface at a side of the cover layer formed with the light modulation layer is laminated on the optical adhesive layer by the lamination process to complete the preparation of the display substrate In an exemplary embodiment, the preparation process of the display substrate may include: sequentially preparing a base, a driving structure layer, a light emitting structure layer and a reflective layer on the glass carrier plate. The preparation process may be similar to the preparation process described in the previous embodiments. Subsequently, an optical adhesive layer is coated on the reflective layer, and the cover layer is laminated on the optical adhesive layer by the lamination process, and then the multiple sub-layers are sequentially deposited by the low-temperature deposition process, and the light modulation layer is formed on the surface at the side of the cover layer away from the base to complete the preparation of the display substrate.

Figure 12:
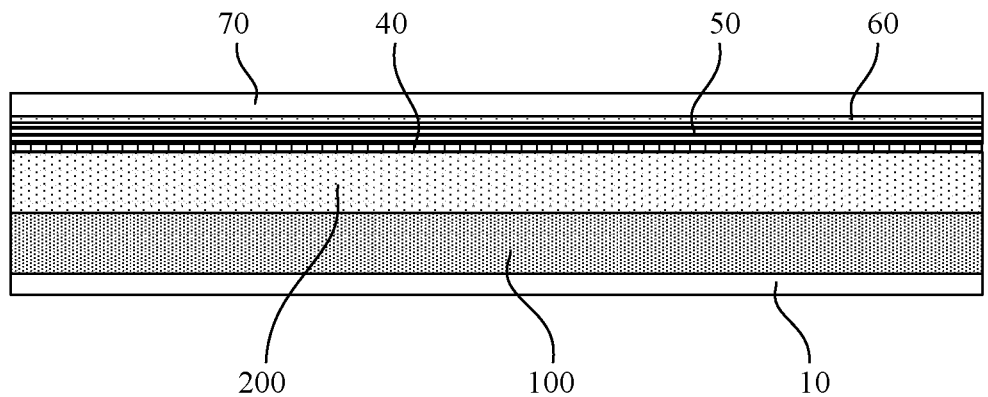
FIG. 12 is a schematic diagram of a structure of yet another display substrate according to an exemplary embodiment of the present disclosure.

FIG. 12 is a schematic diagram of a structure of yet another display substrate according to an exemplary embodiment of the present disclosure, which illustrates a structure of mirror OLED. As shown in FIG. 12, in an exemplary embodiment, a display substrate includes a base 10, a driving structure layer 100 arranged on a surface at a side of the base 10 away from the base 10, a light emitting structure layer 200 arranged on a surface at a side of the driving structure layer 100 away from the base 10, a semi-transparent and semi-reflective layer 40 arranged on a surface at a side of the light emitting structure layer 200 away from the base 10, a light modulation layer 50 arranged on a surface at a side of the semi-transparent and semi-reflective layer 40 away from the base 10, an optical adhesive layer 60 arranged on a surface at a side of the light modulation layer 50 away from the base 10, and a cover layer 70 arranged on a surface at a side of the optical adhesive layer 60 away from the base 10. In an exemplary embodiment, the structures of the driving structure layer 100, the light emitting structure layer 200 and the light modulation layer 50 are similar to those in the above embodiments.

In an exemplary embodiment, the semi-transparent and semi-reflective layer 40 may employ an advanced polarizer film (APF), or may employ a multilayer optical film (APF/POL) of a combination of the advanced polarizer film and polarizer, and the semi-transparent and semi-reflective layer 40 may be laminated on the encapsulation structure layer of the light emitting structure layer using the lamination process. In an exemplary embodiment, a protection layer may be disposed between the light emitting structure layer and the semi-transparent and semi-reflective layer, or the protection layer may be disposed between the semi-transparent and semi-reflective layer and the light modulation layer. The mirror layer of the exemplary embodiment of the present disclosure adopts a semi-transparent and semi-reflective layer, and has the characteristics of simple process, low preparation cost and the like because of adopting a film lamination process.

Figure 13:
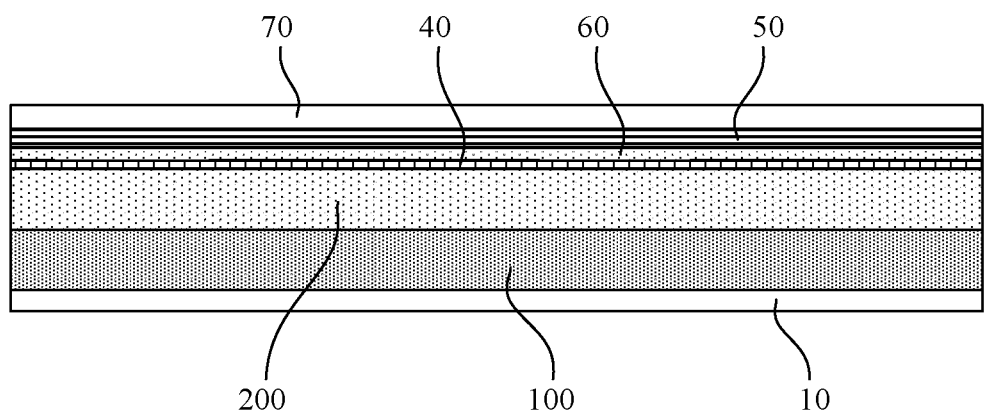
FIG. 13 is a schematic diagram of a structure of yet another display substrate according to an exemplary embodiment of the present disclosure.

FIG. 13 is a schematic diagram of a structure of yet another display substrate according to an exemplary embodiment of the present disclosure, which illustrates a structure of mirror OLED. As shown in FIG. 13, in an exemplary embodiment, a display substrate includes a base 10, a driving structure layer 100 arranged on a surface at a side of the base 10 away from the base 10, a light emitting structure layer 200 arranged on a surface at a side of the driving structure layer 100 away from the base 10, a semi-transparent and semi-reflective layer 40 arranged on a surface at a side of the light emitting structure layer 200 away from the base 10, an optical adhesive layer 60 arranged on a surface at a side of the semi-transparent and semi-reflective layer 40 away from the base 10, a light modulation layer 50 arranged on a surface at a side of the optical adhesive layer 60 away from the base 10, and a cover layer 70 arranged on a surface at a side of the light modulation layer 50 away from the base 10. In an exemplary embodiment, the light modulation layer 50 is arranged on a surface at a side of the cover layer 70 adjacent to the base 10, and the structures of the driving structure layer 100, the light emitting structure layer 200, the semi-transparent and semi-reflective layer 40 and the light modulation layer 50 may be similar to the corresponding structures described in the foregoing embodiments. The light modulation layer 50 may be formed on the cover layer 70.

Figure 14:
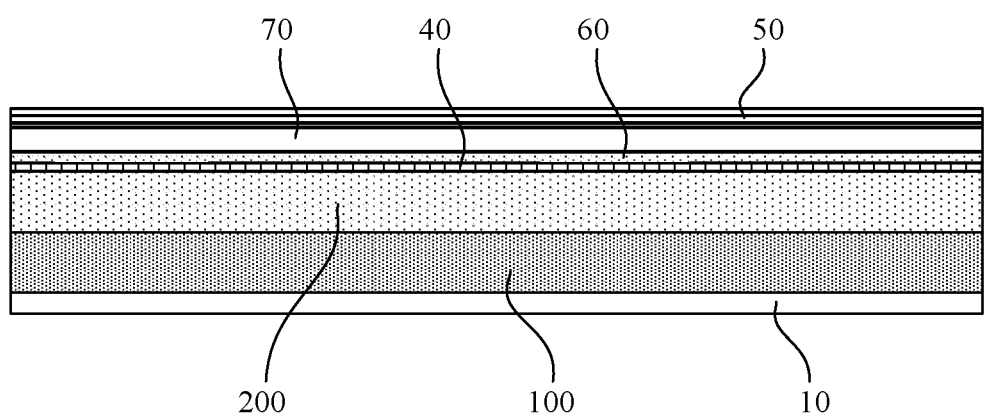
FIG. 14 is a schematic diagram of a structure of yet another display substrate according to an exemplary embodiment of the present disclosure.

FIG. 14 is a schematic diagram of a structure of yet another display substrate according to an exemplary embodiment of the present disclosure, which illustrates a structure of mirror OLED. As shown in FIG. 14, in an exemplary embodiment, a display substrate includes a base 10, a driving structure layer 100 arranged on a surface at a side of the base 10 away from the base 10, a light emitting structure layer 200 arranged on a surface at a side of the driving structure layer 100 away from the base 10, a semi-transparent and semi-reflective layer 40 arranged on a surface at a side of the light emitting structure layer 200 away from the base 10, an optical adhesive layer 60 arranged on a surface at a side of the semi-transparent and semi-reflective layer 40 away from the base 10, a cover layer 70 arranged on a surface at a side of the optical adhesive layer 60 away from the base 10, and a light modulation layer 50 arranged on a surface at a side of the cover layer 70 away from the base 10. In an exemplary embodiment, the light modulation layer 50 is arranged on a surface at a side of the cover layer 70 away from the base 10, and the structures of the driving structure layer 100, the light emitting structure layer 200, the semi-transparent and semi-reflective layer 40 and the light modulation layer 50 may be similar to the corresponding structures described in the foregoing embodiments. The light modulation layer 50 may be formed on the cover layer 70.

The present disclosure exemplifies a structure of a display substrate and a preparation process therefor by taking a mirror OLED as an example and is not intended to limit the present disclosure. In an exemplary embodiment, the light modulation layer of the present disclosure may be applied to other OLED structures. For example, as for a top-emitting OLED structure, no mirror layer is arranged on the light emitting structure layer and the light modulation layer may be disposed directly on the light emitting structure layer. As another example, as for a bottom-emitting OLED structure, a mirror layer is not arranged on the driving structure layer, and the light modulation layer may be directly arranged on a surface at a side of the base adjacent to the light emitting structure layer, or may be directly arranged on the surface at the side of the base away from the light emitting structure layer, which are not limited in the present disclosure. In an exemplary embodiment, the light modulation layer of the present disclosure may be applied to an LCD display panel including an array substrate and a color film substrate disposed oppositely. For example, the light modulation layer may be arranged on a side of the color film substrate adjacent to the array substrate or may be arranged on a side of the color film substrate away from the array substrate. As another example, the light modulation layer may be arranged on a side of the array substrate adjacent to the color film substrate, or may be arranged on a side of the array substrate away from the color film substrate, which are not limited in the present disclosure.

The present disclosure further provides a preparation method for a display substrate. In an exemplary embodiment, the preparation method of the display substrate may include: steps S1 and S2

S1 includes sequentially forming a light emitting unit layer and a mirror layer arranged on the light emitting unit layer on the base. The mirror layer includes a reflective layer, and light transmission holes are arranged on the reflective layer; alternatively, the mirror layer includes a semi-transparent and semi-reflective layer;

S2 includes forming a light modulation layer configured to form a mirror display of a set color.

In an exemplary embodiment, forming a light modulation layer may include: sequentially forming a first sub-layer, a second sub-layer and a third sub-layer on the mirror layer, or sequentially forming a first sub-layer, a second sub-layer, a third sub-layer, a fourth sub-layer and a fifth sub-layer on the mirror layer.

The first sub-layer, the third sub-layer and the fifth sub-layer are a first refractive index layer with a first refractive index, and the second sub-layer and the fourth sub-layer are a second refractive index layer with a second refractive index, and the first refractive index is greater than the second refractive index.

In an exemplary embodiment, forming the light modulation layer may include: sequentially forming a first sub-layer, a second sub-layer and a third sub-layer on the mirror layer; or sequentially forming a first sub-layer, a second sub-layer, a third sub-layer, a fourth sub-layer and a fifth sub-layer on the mirror layer.

Each of the first sub-layer, the third sub-layer and the fifth sub-layer is the first refractive index layer with the first refractive index, each of the second sub-layer and the fourth sub-layer is the second refractive index layer with the second refractive index, and the first refractive index is greater than the second refractive index.

An optical adhesive layer is coated on the mirror layer, and a cover layer formed with the light modulation layer is laminated on the optical adhesive layer by a lamination process.

In an exemplary embodiment, the light modulation layer is arranged on a surface at a side of the cover layer adjacent to the base, or on a surface at a side of the cover layer away from the base.

In an exemplary embodiment, a thickness of the first sub-layer may range from about 40 nm to 140 nm, the thickness of the second sub-layer may range from about 40 nm to 220 nm, the thickness of the third sub-layer may range from about 40 nm to 140 nm, the thickness of the fourth sub-layer may range from about 40 nm to 220 nm, and the thickness of the fifth sub-layer may range from about 40 nm to 140 nm.

The process for preparing the display substrate has been described in detail in the previous embodiments and will not be repeated here.

The present disclosure provides a preparation method of a display substrate. The setting of a light modulation layer not only achieves mirror display of diverse color, but also effectively avoids external light reflection. The formed color mirror display substrate cannot be disposed with a circular polarizer, thus greatly reducing light loss. Exemplary embodiments of the present disclosure can not only reduce power consumption but also increase service life under the same luminance condition. Further, the exemplary embodiments of the present disclosure show that the preparation method of the display substrate does not increase the number of patterning, does not need to increase process devices, and has good process compatibility and strong practicability.

The present disclosure further provides a display apparatus, including the aforementioned display substrate. The display apparatus may be any product or component with display function such as mobile phone, tablet computer, TV set, display, notebook computer, digital photo frame, navigator, or may be wearable display apparatus, vehicle rear-view mirror, ATM cash machine display screen, advertising device and home appliance display device and the like.

Although the implementations disclosed in the present disclosure are as above, the described contents are only implementation adopted for convenience of understanding the present disclosure and are not intended to limit the present disclosure. A person skilled in the art may make any modification and change to the implementation form and details without departing from the essence and scope of the present disclosure. However, the scope of patent protection of the present disclosure should still be subject to the scope defined by the appended claims.

The invention claimed is:

1. A display substrate comprising a light emitting unit layer arranged on the base and a mirror layer arranged on the light emitting unit layer; wherein
   a light modulation layer is arranged on a side of the mirror layer away from the base, and
   the light modulation layer is configured to form a mirror display of a set color;
   wherein the light modulation layer comprises a plurality of sub-layers stacked,
   the plurality of sub-layers comprise a first refractive index layer with a first refractive index and a second refractive index layer with a second refractive index,
   the first refractive index layer and the second refractive index layer are alternately arranged in the plurality of sub-layers,
   the first refractive index is greater than the second refractive index;
   the light modulation layer comprises a first sub-layer, a second sub-layer, a third sub-layer, a fourth sub-layer and a fifth sub-layer that are stacked; wherein
   each of the first sub-layer, the third sub-layer and the fifth sub-layer is the first refractive index layer with the first refractive index, and each of the second sub-layer and the fourth sub-layer is the second refractive index layer with the second refractive index;
   the mirror layer comprises a reflective layer, and the reflective layer is provided with light transmission holes thereon corresponding to a plurality of light emitting units;
   the display substrate further comprises an optical adhesive layer, the optical adhesive layer fills the light transmission holes of the reflective layer, and the light modulation layer is arranged on a surface at a side of the optical adhesive layer away from the base, and is in direct contact with the optical adhesive layer.

2. The display substrate according to claim 1, wherein the display substrate further comprises a cover layer arranged on a surface at a side of the light modulation layer away from the base.

3. The display substrate according to claim 1, wherein a thickness of the first sub-layer ranges from 40 nm to 140 nm, the thickness of the second sub-layer ranges from 40 nm to 220 nm, the thickness of the third sub-layer ranges from 40 nm to 140 nm, the thickness of the fourth sub-layer ranges from 40 nm to 220 nm, and the thickness of the fifth sub-layer ranges from 40 nm to 140 nm.

4. The display substrate according to claim 1, wherein when the light modulation layer comprises a first sub-layer, a second sub-layer, and a third sub-layer that are stacked;
wherein materials for the reflective layer comprises aluminum, and
the thickness of the first sub-layer ranges from 40 nm to 90 nm, the thickness of the second sub-layer ranges from 90 nm to 110 nm, and the thickness of the third sub-layer ranges from 40 nm to 90 nm; or
the thickness of the first sub-layer ranges from 70 nm to 140 nm, the thickness of the second sub-layer ranges from 190 nm to 210 nm, and the thickness of the third sub-layer ranges from 70 nm to 140 nm;
wherein materials for the reflective layer comprises molybdenum, and
the thickness of the first sub-layer ranges from 70 nm to 140 nm, the thickness of the second sub-layer ranges from 90 nm to 110 nm, and the thickness of the third sub-layer ranges from 70 nm to 140 nm; or
the thickness of the first sub-layer ranges from 80 nm to 140 nm, the thickness of the second sub-layer ranges from 190 nm to 210 nm, and the thickness of the third sub-layer ranges from 80 nm to 140 nm.

5. The display substrate according to claim 1, wherein within the visible light range, the first refractive index ranges from 1.6 to 2.5 and the second refractive index ranges from 1.3 to 1.5.

6. A display apparatus, comprising the display substrate according to claim 1.

7. A preparation method for a display substrate, comprising:
sequentially forming a light emitting unit layer and a mirror layer arranged on the light emitting unit layer on the base; and
forming a light modulation layer configured to form a mirror display of a set color;
wherein forming the light modulation layer comprises:
sequentially forming a first sub-layer, a second sub-layer, a third sub-layer, a fourth sub-layer and a fifth sub-layer on the mirror layer; wherein
each of the first sub-layer, the third sub-layer and the fifth sub-layer is the first refractive index layer with the first refractive index, and each of the second sub-layer and the fourth sub-layer is the second refractive index layer with the second refractive index, and the first refractive index is greater than the second refractive index;
wherein forming the light modulation layer comprises:
sequentially forming a first sub-layer, a second sub-layer and a third sub-layer on a cover layer; or sequentially forming a first sub-layer, a second sub-layer, a third sub-layer, a fourth sub-layer and a fifth sub-layer on the cover layer; wherein each of the first sub-layer, the third sub-layer and the fifth sub-layer is the first refractive index layer with the first refractive index, each of the second sub-layer and the fourth sub-layer is the second refractive index layer with the second refractive index, and the first refractive index is greater than the second refractive index; and
coating an optical adhesive layer on the mirror layer, and laminating the cover layer formed with the light modulation layer on the optical adhesive layer by a lamination process;
wherein the mirror layer comprises a reflective layer, and the reflective layer is provided with light transmission holes thereon corresponding to a plurality of light emitting units;
the optical adhesive layer fills the light transmission holes of the reflective layer, and the light modulation layer is arranged on a surface at a side of the optical adhesive layer away from the base, and is in direct contact with the optical adhesive layer.

8. The preparation method according to claim 7, wherein the cover layer is arranged on a surface at a side of the light modulation layer away from the base.

9. The preparation method according to claim 8, wherein the thickness of the first sub-layer ranges from 40 nm to 140 nm, the thickness of the second sub-layer ranges from 40 nm to 220 nm, the thickness of the third sub-layer ranges from 40 nm to 140 nm, the thickness of the fourth sub-layer ranges from 40 nm to 220 nm, and the thickness of the fifth sub-layer ranges from 40 nm to 140 nm.

10. The preparation method according to claim 7, wherein the thickness of the first sub-layer ranges from 40 nm to 140 nm, the thickness of the second sub-layer ranges from 40 nm to 220 nm, the thickness of the third sub-layer ranges from 40 nm to 140 nm, the thickness of the fourth sub-layer ranges from 40 nm to 220 nm, and the thickness of the fifth sub-layer ranges from 40 nm to 140 nm.

* * * * *